(12) United States Patent
Laufer et al.

(10) Patent No.: US 7,524,072 B2
(45) Date of Patent: Apr. 28, 2009

(54) OPTICAL COMPONENT, COMPRISING A MATERIAL WITH A PREDETERMINED HOMOGENEITY OF THERMAL EXPANSION

(75) Inventors: Timo Laufer, Aalen (DE); Johannes Zellner, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 239 days.

(21) Appl. No.: 11/016,059

(22) Filed: Dec. 17, 2004

(65) Prior Publication Data
US 2005/0185307 A1 Aug. 25, 2005

(30) Foreign Application Priority Data
Dec. 17, 2003 (DE) ................ 103 59 102

(51) Int. Cl.
*G02B 5/08* (2006.01)
*G02B 1/00* (2006.01)

(52) U.S. Cl. ............... 359/846; 359/883; 428/912.2; 501/4

(58) Field of Classification Search ............. 359/650, 359/845, 846, 848, 883; 250/492; 65/17.4, 65/17.6, 397; 430/5; 355/53, 67, 69; 356/399; 438/72, 736, 947, 974; 219/390, 405, 411; 378/35; 428/912.2; 501/4, 54
See application file for complete search history.

(56) References Cited

U.S. PATENT DOCUMENTS

| | | | | |
|---|---|---|---|---|
| 2,326,056 A | | 8/1943 | Nadeau et al. ................ 95/8 |
| 3,700,471 A | * | 10/1972 | Duke ........................ 501/4 |
| 5,501,784 A | * | 3/1996 | Lessmollmann et al. ...... 205/67 |

(Continued)

FOREIGN PATENT DOCUMENTS

EP 0955565 10/1999

(Continued)

OTHER PUBLICATIONS

K.Hrdina, et al, "Characterization and Characteristics of a ULE® Glass Tailored for the EUVL-needs" in *Proc. SPIE* vol. 4688, p. 454-461 (Jul. 2002).

(Continued)

*Primary Examiner*—Stephone B. Allen
*Assistant Examiner*—Jennifer L Doak
(74) *Attorney, Agent, or Firm*—Ohlandt, Greeley, Ruggiero & Perle, L.L.P.

(57) ABSTRACT

There is provided an optical component. The optical component includes a material having a coefficient of thermal expansion $\alpha$, where the coefficient of thermal expansion is dependent on location. The following applies to the location-dependent coefficient of thermal expansion:

$$\alpha = \bar{\alpha} \pm \Delta\alpha,$$

with $\Delta\alpha$ being the maximum deviation of the coefficient of thermal expansion from the mean value of the coefficient of thermal expansion $\bar{\alpha}$ of the material. The following homogeneity condition applies to the material:

$$|\Delta\alpha| \leq \left(0.14 + 0.1 \cdot x + \frac{390}{x}\right) \cdot \frac{\bar{\varepsilon}}{Q}$$

with the progress of the lacation-dependent progress of the coefficient of thermal expansion being periodical with a wavelength x given in mm, and the thermal output which is absorbed by the optical component being designated by Q given in watts (W), the resulting emissivity being designated by $\bar{\varepsilon}$, and $|\Delta\alpha|$ in units of $$\frac{ppb}{K}.$$

34 Claims, 7 Drawing Sheets

U.S. PATENT DOCUMENTS

| | | | | |
|---|---|---|---|---|
| 5,698,484 | A * | 12/1997 | Maxon | 205/67 |
| 6,353,470 | B1 | 3/2002 | Dinger | 355/71 |
| 6,465,272 | B1 * | 10/2002 | Davis et al. | 438/72 |
| 6,576,380 | B2 * | 6/2003 | Davis et al. | 430/5 |
| 6,606,883 | B2 * | 8/2003 | Hrdina et al. | 65/17.4 |
| 6,703,589 | B1 * | 3/2004 | Probst | 219/390 |
| 7,042,631 | B2 * | 5/2006 | Smith et al. | 359/333 |
| 2002/0131181 | A1 * | 9/2002 | Singer et al. | 359/636 |
| 2002/0157421 | A1 * | 10/2002 | Ackerman et al. | 65/17.6 |
| 2002/0171817 | A1 * | 11/2002 | Babonneau et al. | 355/67 |
| 2003/0091910 | A1 * | 5/2003 | Schwarzl et al. | 430/5 |
| 2003/0125184 | A1 | 7/2003 | Mitra | 501/7 |
| 2003/0226375 | A1 | 12/2003 | Bernas et al. | 54/17.2 |
| 2003/0226377 | A1 | 12/2003 | Barrett et al. | 65/17.4 |
| 2004/0027555 | A1 | 2/2004 | Hrdina et al. | 356/33 |
| 2005/0045318 | A1 | 3/2005 | Hrdina et al. | 65/17.2 |
| 2005/0179995 | A1 * | 8/2005 | Nikolov et al. | 359/359 |

FOREIGN PATENT DOCUMENTS

| | | |
|---|---|---|
| EP | 1123195 | 11/2004 |

OTHER PUBLICATIONS

P.C.Schultz, H.T.Smyth, "Ultra low expansion glasses and their structure in the $SiO_2$-$TiO_2$—System", Amorphous Materials, Sep. 1970, pp. 453-461.

Henry E. Hagy, "High Precision Photoelectric and Ultrasonic Techniques for Determining Absolute and Differential Thermal Expansion of Titania-Silica Glass", Applied Optics, vol. 12, No. 7, Jul. 1973.

H.E. Hagy et al, "Determining absolute thermal expansion of titania-silica glasses: a refined ultrasonic method", Applied Optics, vol. 14, No. 9, pp. 2099-2103, Sep. 1975.

Edwards et al, "Improved precision of absolute thermal expansion measurements for ULE glass", Proc. of SPIE, vol. 2857, Advanced Materials for Optical and Precision Structures, Ed.: M.A. Ealey, Nov. 1996.

Mitra et al, "Thermal Expansion Behaviour of Proposed EUVL Substrate Materials", SPIE-Microlithography, *Proc. SPIE* vol. 4688, p. 462-468 (Jul. 2003).

Müller et al, "Ultraprecision Dilatometer System for Thermal Expansion measurements on Low Expansion Glasses", 12th Thermal Expansion Symposium, Pittsburgh/PA, P.S. Gaal and D.E. Apostolescu eds., 1997.

* cited by examiner

OPTICAL COMPONENT, COMPRISING A MATERIAL WITH A PREDETERMINED HOMOGENEITY OF THERMAL EXPANSION

CROSS-REFERENCE TO RELATED APPLICATION

The present application is claiming priority of German Patent Application No. 103 59 102.8, filed on Dec. 17, 2003, the content of which is herein incorporated by reference.

BACKGROUND OF THE INVENTION

1. Field of the Invention

The invention relates to an optical component comprising a material which has a coefficient of thermal expansion $\alpha$, with the coefficient of thermal expansion being dependent on location.

2. Description of the Related Art

In the present application the coefficient of thermal expansion $\alpha$ (CTE) is understood as the first derivation of the thermal expansion $\Delta L/L$, the so-called thermal expansion, according to temperature.

Such optical components are of special interest in the field of X-ray lithography. This applies especially to lithography with soft X-rays, the so-called EUV lithography in the wavelength range of 10 to 30 nm. Mirrors with a high reflectivity in the X-ray range are used as optical components in the field of X-ray lithography. Such mirrors can be operated close to perpendicular incidence as so-called normal-incidence mirrors or in grazing incidence as so-called grazing-incidence mirrors. Mirrors are called grazing-incidence mirrors when the rays of a ray bundle impinging on the mirrors impinge under angles of $\beta > 70°$ relative to the surface normal.

X-ray mirrors with a high reflectivity in the X-ray region which are operated as normal-incidence mirrors comprise a substrate material and, based thereon, a multilayer system, e.g. a Mo/Si multilayer system or a Mo/Be multilayer system or a MoRu/Be multilayer system. With such systems it is possible to achieve in the EUV range reflectivities of over 50% and even of over 60%.

Depending on the wavelength of the light to be reflected it is also possible to use layer systems of other materials.

In addition to X-ray mirrors which are operated as normal-incidence mirrors, it is also possible to use mirrors operated in grazing incidence, i.e. so-called grazing-incidence mirrors. Such mirrors also comprise a substrate material. A simpler layer system is applied to the substrate material. The applied layer can be a ruthenium, palladium or rhodium layer.

It is desirable that high image-forming qualities are achieved for X-ray mirrors used in the field of EUV lithography, especially in projection objectives.

Since X-radiation (as explained above) is reflected completely neither under normal incidence nor under grazing incidence, energy is introduced into the mirrors, so that the mirrors or other optical components of an EUV system will heat up. The increase in temperature of the respective optical component by absorption of the EUV radiation impinging upon the optical component or mirror leads to the consequence that the image-forming quality is influenced as a result of thermal expansion. Other heat sources that can lead to the heating of the optical components such as the mirrors are the mirror actuators for example.

The minimization of thermal effects in optical components which are used in EUV projection systems is the subject matter of EP 0 955 565.

For the purpose of suppressing thermal effects, the mirrors known from EP 0 955 565 comprise a metallic substrate as the substrate material. Owing to the favorable thermal conductivity of the metals, the heat introduced into the mirrors is removed efficiently by a cooling apparatus preferably via the rear sides of the metal substrates. Although thermally induced mirror deformations can be reduced in this manner, it is not possible to avoid aberrations. Considerable aberrations still occur.

SUMMARY OF THE INVENTION

It is therefore the object of the present invention to overcome the disadvantages of the state of the art and to provide an optical component in particular which is characterized in that it substantially prevents aberrations. The avoidance of aberrations should be achieved with the lowest technical effort.

This object is achieved in accordance with the invention in that the optical component comprises a material having a coefficient of thermal expansion $\alpha$, with the coefficient of thermal expansion of the material being dependent upon location and the following applies for the location-dependent coefficient of thermal expansion:

$$\alpha = \bar{\alpha} \pm \Delta\alpha,$$

with $\Delta\alpha$ being the maximum deviation of the coefficient of thermal expansion from the mean value of the coefficient of thermal expansion $\bar{\alpha}$ of the material, and the following homogeneity condition applies to the material:

$$|\Delta\alpha| \leq \left(0.14 + 0.1 \cdot x + \frac{390}{x}\right) \cdot \frac{\bar{\varepsilon}}{\dot{Q}}$$

with the inhomogeneity zones being arranged periodically with a wavelength x, and the thermal output absorbed by the optical component being designated by $\dot{Q}$ given in watts (W), the resulting emissivity being designated by $\bar{\varepsilon}$, and $|\Delta\alpha|$ in units of $$\frac{ppb}{K}.$$

The transmission of heat occurs predominantly by heat radiation.

Preferably, the thermal output $\dot{Q}$ is close to 1 W and the emissivity $\bar{\varepsilon}$ is close to 0.5.

The spatial distribution of the coefficient of thermal expansion of the material of an optical component can be reproduced by superposition of individual spatial wavelengths. The aforementioned homogeneity condition applies depending on a single wavelength. If more than one wavelength is necessary for illustrating the spatial distribution, the homogeneity condition must be fulfilled for every single frequency in order to not exceed the specified aberrations.

For the purpose of describing the spatial distribution of the coefficient of thermal expansion of the material of an optical component, a sinusoid, continuous curve with a maximum value $\alpha + \Delta\alpha$, a minimum value $\alpha - \Delta\alpha$ and wavelength x is assumed. The wavelength x corresponds to the double zone width w, therefore x=2 w applies.

The inventor has found out that the location-dependent fluctuations of the linear coefficient of thermal expansion $\alpha$, i.e. the maximum location-dependent deviations $\Delta\alpha$ of the coefficient of thermal expansion, lead to considerable aberrations in case of heating of the optical component from a medium, generally temperature-dependent value $\overline{\alpha}(T)$ of the material. By using materials which meet the homogeneity requirements it is possible to minimize aberrations and thus image errors.

It applies in general that the larger the width w of an inhomogeneity zone or the wavelength, the larger the resulting aberrations at the same heating and at the same magnitude of the fluctuation $\pm\Delta\alpha$. With increasing zone width w, the inhomogeneity zones influence each other in their expansion to an increasingly lower amount. This means that the maximum expansion or contraction of the individual zones is as large as if they had no more mechanical contact with each other.

The heat exchange of the optical component to the ambient environment (e.g. the mirror housing) occurs substantially by heat radiation and can be described by the resulting emissivity $\overline{\epsilon}$. The resulting emissivity $\overline{\epsilon}$ comprises the emissivity, the absorption and the reflection of the optical component and housing for example in which the optical component is housed. If the optical component concerns a mirror, then the mirror and mirror housings are radiation partners and the resulting emissivity considers the geometric relationship of these radiation partners. $\overline{\epsilon}=1$ can be achieved as the maximum resulting emissivity. In this case no more reflection occurs. A maximum resulting emissivity of $\overline{\epsilon}=1$ occurs when both radiation partners have an emissivity of 1, i.e. both radiation partners are black-body radiators, or each mirror of a projection objective has an emissivity of 1 and the housing in which the mirrors are housed are much larger than the mirror per se.

Depending on the thermal output $\dot{Q}$ absorbed by the material of the optical component in accordance with the invention and the resulting emissivity $\overline{\epsilon}$, the following is obtained as a result of the homogeneity condition:

$$|\Delta\alpha| \leq \left(0.14 + 0.1 \cdot x + \frac{390}{x}\right) \cdot \frac{\overline{\epsilon}}{\dot{Q}}$$

the maximum possible value of the fluctuation of the coefficient of thermal expansion $\pm\Delta\alpha$, at wavelength x, i.e. of an inhomogeneity zone with the width w.

Ti-doped quartz glass or glass ceramics are preferably used as materials which comprise the optical component and which fulfill the homogeneity condition.

The coefficient of thermal expansion can be set in Ti-doped quartz glass by the titanium content. Reference in this respect is made for example to K. Hrdina, B. Z. Hanson, P. M. Fenn, R. Sabia, "Characterization and Characteristics of a ULE® Glass Tailored for the EUVL-needs" in Proc. SPIE Vol. 4688, p. 454-461 (July 2002).

It is therefore possible to influence the coefficient of thermal expansion in Ti-doped quartz glass in a location-dependent manner by setting the Ti-content as in ULE® of Corning GmbH for example. The fulfillment of the homogeneity condition can be ensured by destruction-free measurement of the location-dependent coefficient of thermal expansion.

A glass ceramic material can also be used as an alternative material. Glass ceramic materials have an amorphous and a crystalline phase, with the formation of the crystalline phase being induced by seed crystals. The coefficient of thermal expansion of a glass ceramic material is substantially determined by the ratio of crystalline phase to amorphous phase.

The inhomogeneity condition can be fulfilled by a sufficiently even spatial distribution of both phases.

The previously described and preferred materials of glass ceramics and Ti-doped quartz glass show a mean temperature-dependent coefficient of thermal expansion $\overline{\alpha}(T)$. In an approximating manner, the temperature dependent of the mean coefficient of thermal expansion $\overline{\alpha}(T)$ can be described with $\overline{\alpha}(T)=m\cdot(T-T_0)$ which is the same for the entire material and has a linear or linearizable temperature dependence. Here, m designates the rise of the temperature-dependent linear coefficient of thermal expansion.

Materials such as substrate materials for mirrors with such a progress of the temperature-dependent thermal expansion have the further advantage in addition to the possibility of purposeful setting of the coefficient of thermal expansion and thus the purposeful influencing of the fluctuation $\pm\Delta\alpha$ within the material that layer systems can be applied onto this material without an amorphous intermediate layer. In contrast to this, metallic materials for example require such intermediate layers for applying layer systems. A further advantage of such substrate materials is the low thermal expansion.

The progress of the temperature-dependent coefficient of thermal expansion depending on temperature and the possibility to influence the same by changes in the material properties is described for a Ti-doped quartz glass in "Ultra low expansion glasses and their structure in the $SiO_2$—$TiO_2$—System" of P. C. Schultz, H. T. Smyth, Amorphous Materials, September 1970, pages 453-461 and in the patent U.S. Pat. No. 2,326,056.

The scope of disclosure of these publications shall be fully included in the scope of disclosure of the present application.

Reference is hereby made to the following publications concerning the possibilities for location-dependent determination of the coefficient of thermal expansion depending on material parameters for Ti-doped quartz glass:

"High Precision Photoelectric and Ultrasonic Techniques for Determining Absolute and Differential Thermal Expansion of Titania-Silica Glass", Henry E. Hagy, Applied Optics, Vol. 12, No. 7, July 1973;

"Determining absolute thermal expansion of titania-silica glasses: a refined ultrasonic method", H. E. Hagy, W. D. Shirkey, Applied Optics, Vol. 14, No. 9, pp. 2099-2103, September 1975;

"Improved precision of absolute thermal expansion measurements for ULE glass", Edwards, Bullock, Morton, Proc. of SPIE, Vol. 2857, Advanced Materials for Optical and Precision Structures, Ed.: M. A. Ealey, November 1996.

The scope of disclosure of these publications shall be fully included in the scope of disclosure of the present application.

The connection between the value of the coefficient of thermal expansion α and the titanium content has been described in "Determining absolute thermal expansion of titania-silica glass: a refined ultrasonic method", H. E. Hagy, W. D. Shirkey, Applied Optics, Vol. 14, No. 9, pp. 2099-2103, September 1975. The determination of the coefficient of thermal expansion is carried out according to H. E. Hagy, W. D. Shirkey with ultrasonic measurements by using the fact that the speed of sound within the material depends on the titanium content and the titanium content on the other hand determines the coefficient of thermal expansion. The ultrasonic measurement allows a location-resolved determination of the coefficient of thermal expansion $\geq 6$ mm.

With the help of the method as described in the publication of H. E. Hagy, W. D. Shirkey it is thus possible to determine the distribution of the inhomogeneity zones within the material.

In the case of Zerodur®, the determination of the coefficient of thermal expansion α is made with the help of classical methods in a dilatometer. Reference is hereby made in this respect to "Thermal Expansion Behaviour of Proposed EUVL Substrate Materials", Mitra, Davis, Alkemper, Kohimann, Aschke, Mörsen, Ritter, Hack, Pannhorst, SPIE-Microlithography, Proc. SPIE Vol. 4688, p. 462-468 (July 2003) and "Ultraprecision Dilatometer System for Thermal Expansion measurements on Low Expansion Glasses", Müller, Erb, Haug, Klaas, Lindig, Wetzig, $12^{th}$ Thermal Expansion Symposium, Pittsburgh/Pa., P. S. Gaal and D. E. Apostolescu eds., 1997.

For determining the inhomogeneity distribution, a block of a glass ceramic material is mechanically divided into equally large elements, e.g. by sawing, and the coefficient of thermal expansion α is measured individually for each of the elements in the dilatometer. A map with a location-dependent coefficient of thermal expansion for a glass ceramic material is thus obtained.

The temperature-dependent and location-dependent coefficient of thermal expansion is defined according to "Ultra low expansion glasses and their structure in the $SiO_2$—$TiO_2$—System" of P. C. Schultz, H. T. Smyth, Amorphous Materials, September 1970, pages 453-461, as the change in the expansion of a body ΔL relating to a reference length L over the temperature T, with the following applying in "Ultra low expansion glasses and their structure in the $SiO_2$—$TiO_2$—System" of P. C. Schultz, H. T. Smyth, Amorphous Materials, September 1970, pages 453-461:

$$\bar{\alpha}(T) = \frac{1}{L} \cdot \frac{\partial L}{\partial T}$$

According to P. C. Schultz, H. T. Smyth, Amorphous Materials, September 1970, pages 453-461, the temperature-dependent coefficient of thermal expansion has a value $\alpha(T_o)=0$ at a temperature $T_o$, the so-called zero-expansion point or the zero-crossing point. The temperature $T_o$ of the zero-crossing point is dependent on the $TiO_2$ content.

The temperature-dependent coefficient of thermal expansion α(T) of glass ceramic materials also has a value $\alpha(T_o)=0$ at a temperature $T_o$ for certain compositions, i.e. a zero-expansion point or a zero-crossing point.

As a result of the roughness values of the glass ceramic material or $TiO_2$-doped glass, a layer system comprising a plurality of layers which form a multiple multilayer system for a normal incidence mirror can be arranged on the surface of such a glass or such a glass ceramic material. It is similarly possible, when using a glass ceramic material in accordance with the invention or a glass as a substrate material, to apply a coating for a grazing-incidence EUV mirror. An intermediate layer which is applied for achieving the optical surface quality as described in EP 0955565 between the substrate material and the coating is not necessary.

In addition to the optical components, the invention also provides an illumination system and a projection objective and a projection exposure system which comprises at least one such optical component.

BRIEF DESCRIPTION OF THE DRAWINGS

The invention will now be explained below in closer detail by reference to the embodiments shown in the drawings, wherein.

DESCRIPTION OF THE INVENTION

Figure 1:
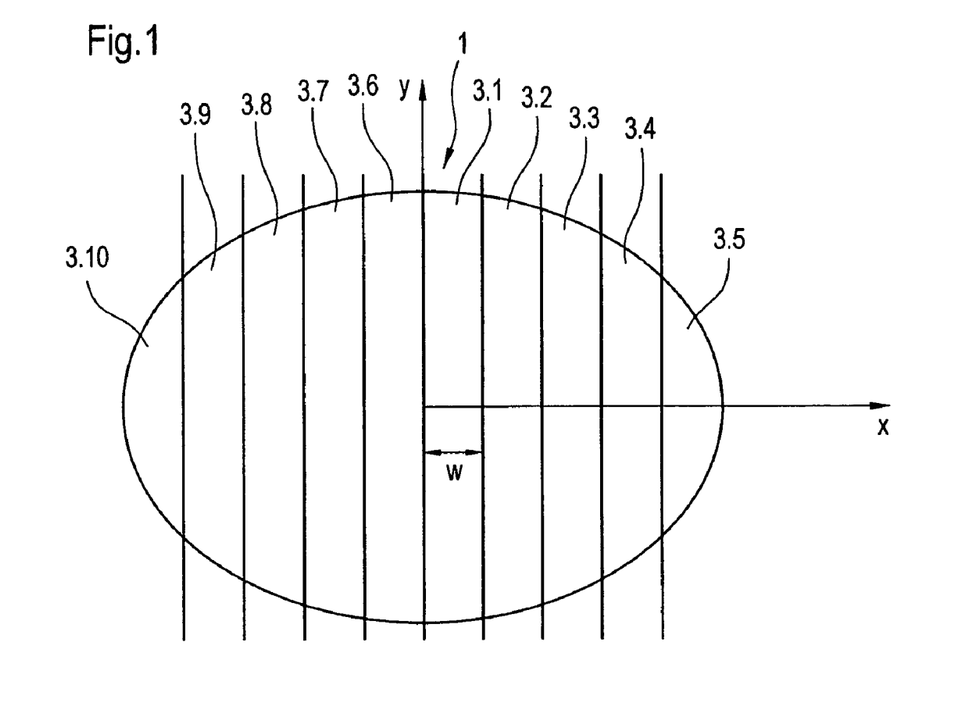
FIG. 1 shows a mirror surface which is divided into inhomogeneity zones of a width w in a dimension along the x-direction.

FIG. 1 shows the surface of a mirror as an example for an optical component. Although it is explained below as an example for mirrors or mirror substrates, the invention can also be applied to other optical components such as reticle masks without departing from the idea of the invention. The mirror substrate shown in FIG. 1 shows as an example three evenly sized inhomogeneity zones 3.1, 3.2, 3.3, 3.4, 3.5, 3.6, 3.7, 3.8, 3.9 and 3.10 of width w, with the coefficient of thermal expansion fluctuation in an alternating fashion about ±Δα around a mean value $\bar{\alpha}$. The division of the mirror substrate as shown in FIG. 1 is a one-dimensional division in the x-direction. The inhomogeneity zones as shown in FIG. 1 can also be arranged in a fan-like radial way.

Figure 2:
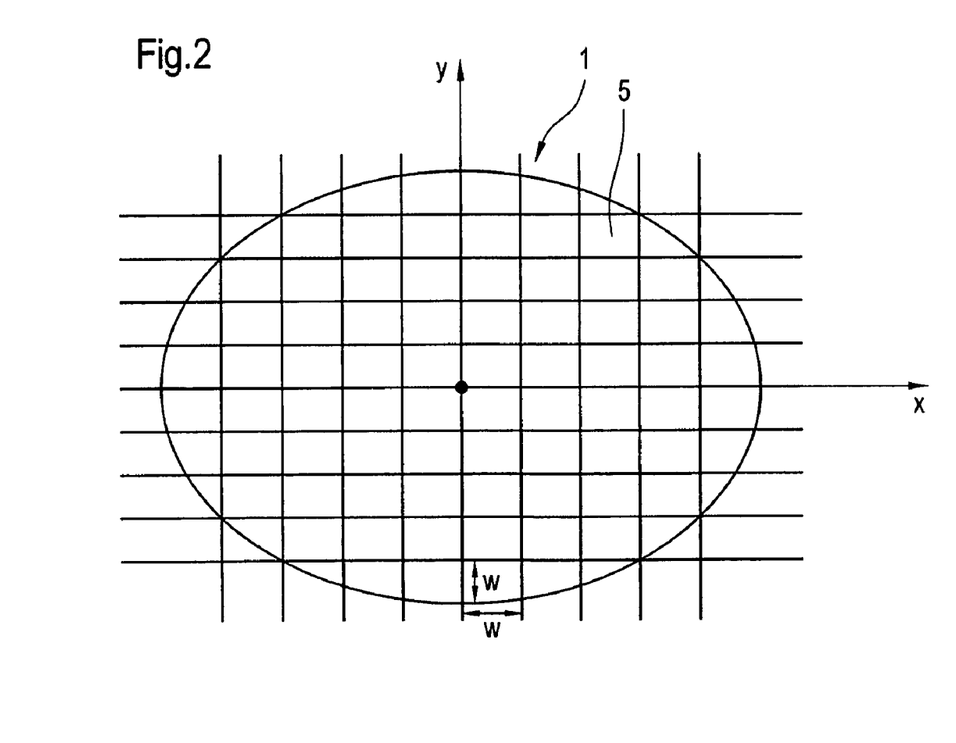
FIG. 2 shows a substrate surface which is divided into inhomogeneity zones in the x- and y-direction.

As an alternative it is possible to define the inhomogeneity zones (as shown in FIG. 2) as cuboids of width w in the x- as well as y-direction. In addition, a superimposition of any form to inhomogeneity distributions in the x-, y- and z-direction is possible.

The arrangement of the inhomogeneity zones is obtained for example from measuring the coefficient of thermal expansion of a real mirror surface and the subsequent Fourier decomposition of the coefficient of thermal expansion in periodic functions with a wavelength x. The Fourier decomposition can occur in a one-dimensional or two-dimensional way.

Figure 3:
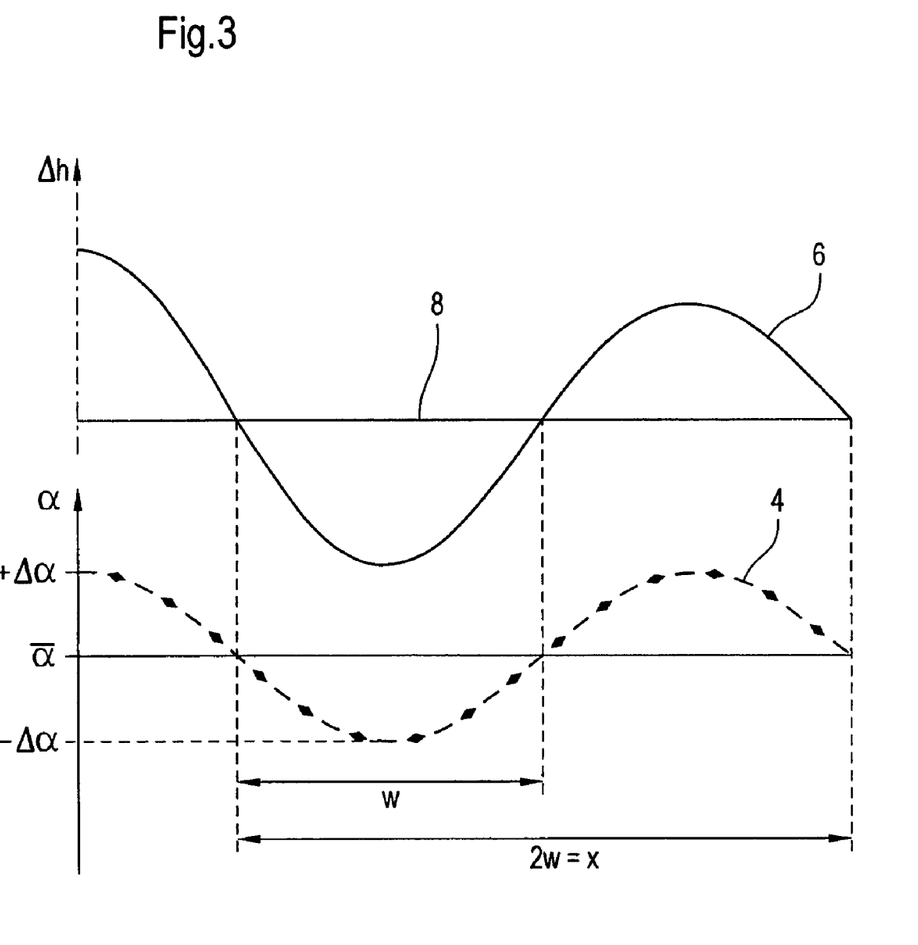
FIG. 3 shows the amplitude of the deformation of the mirror surface as a result of fluctuations of the coefficient of thermal expansion by ±Δα around a mean value $\bar{\alpha}$ of the coefficient of thermal expansion at a zone width of w, with a sine function being assumed for the spatial progress of the thermal expansion.

Subsequently, the maximum permissible fluctuation ±Δα is to be stated which is obtained from the homogeneity requirements placed on the coefficient of thermal expansion. A maximum image error, depending on the optical specification of the system, should not be exceeded. A periodic sine profile with an amplitude of +Δα and −Δα about the mean coefficient of thermal expansion $\bar{\alpha}$ is assumed in curve 4 of the coefficient of thermal expansion according to FIG. 3. Such a profile 4 is shown in FIG. 3. The inhomogeneity zones are adjacent with respect to each other and the width w of the inhomogeneity zone is half the wavelenght x of sine function 4.

FIG. 3 further shows the deformation amplitude Δh of the surface of the material of the optical component as a result of the thermal load $\dot{Q}$ as absorbed by the material and the fluctuation $\pm\Delta\alpha$ of the coefficient of thermal expansion. The deformed mirror surface is designated with reference numeral 6 and the non-deformed mirror surface with reference numeral 8.

Figure 4:
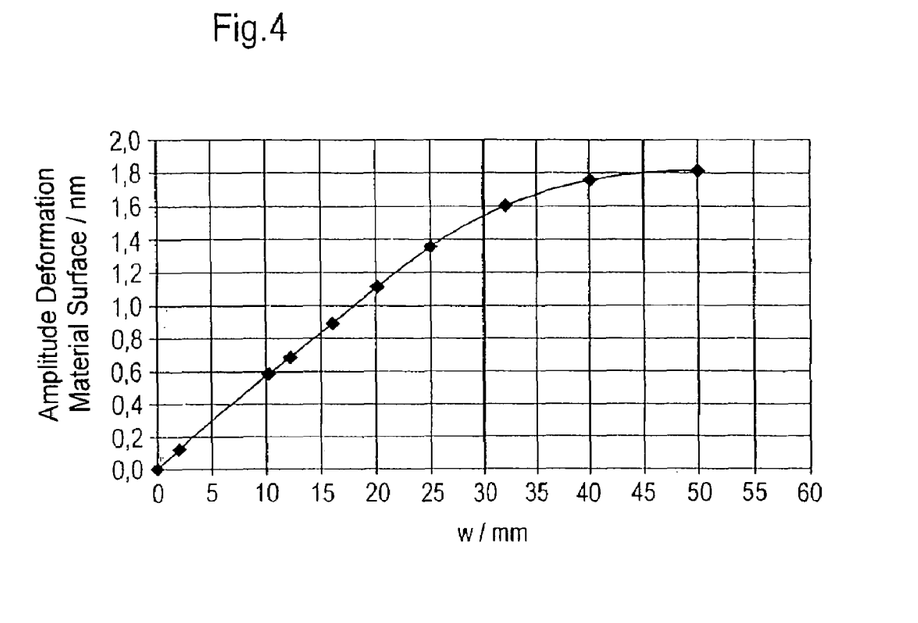
FIG. 4 shows the dependence of the amplitude of the deformation on the width w of the inhomogeneity zone, with a sine function for the spatial progress of the thermal expansion being assumed, as shown in FIG. 3.

The connection between the amplitude of the deformation of the material surface and the width w of the inhomogeneity zone is stated in FIG. 4. It shows that the deformation increases at first linearly with the width of the inhomogeneity zone and approaches an asymptotic value in the case of very wide inhomogeneity zones.

This is caused by the fact that from a certain width w the maximum thermal expansion of the zones is so large as if the zones no longer had any mechanical interaction any more among each other.

As is clear from FIG. 4, it applies in the linear region for low widths w that the larger the width the larger the amplitude Δh of the deformation and the resulting aberrations at the same heating and at the same fluctuation Δα. The deformation amplitude of the surface of the material of the optical component which is dependent upon the width of the inhomogeneity zone can be converted into an aberration dependent on the width w of the inhomogeneity zone.

The aberration is determined by a deformation of the wave front of the optical projection. This deformation of the wave front can be developed for example in Zernike polynomials.

Depending on the width w of the inhomogeneity zone, the thermal output $\dot{Q}$ as absorbed by the optical component, the resulting emissivity $\bar{\epsilon}$ and the maximum permissible aberrations caused by the optical component, the following inequation follows for the material of the optical component from which the maximum deviation Δα can be determined:

$$|\Delta\alpha| \leq \left(0.14 + 0.1 \cdot x + \frac{390}{x}\right) \cdot \frac{\bar{\epsilon}}{\dot{Q}}$$

The exchange of heat of the optical component with its ambient environment (e.g. with the mirror housing) occurs substantially by heat radiation. The resulting emissivity $\bar{\epsilon}$ comprises the emissivity, the absorption and the reflection of the optical component for example and an enclosing housing such as a mirror or mirror housing as radiation partner and considers the geometric relationship of the radiation partners. The radiation partners such as mirrors and mirror housings act over wide wavelength ranges as non-selective radiators, i.e. the emissivity, the absorption and the reflection are each independent of wavelength. The exchange of radiation occurs according to Lambert's cosine law, i.e. the intensity of heat radiation is independent of direction.

In the FIGS. 5*a* through 5*e* |Δα| is shown with $\dot{Q}=1$ W and $\bar{\epsilon}=0.5$ depending wavelength x, with FIG. 5 showing the boundary curve 10*a* for the condition $$|\Delta\alpha| \leq \left(0.07 + \frac{0.05 \cdot x}{mm} + \frac{195 \text{ mm}}{x}\right)\frac{ppb}{K}$$

Figure 5A:
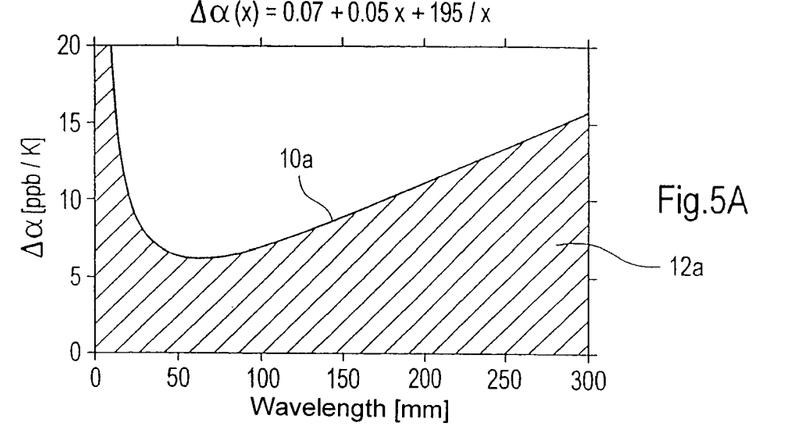
FIGS. 5a-5e show the dependence of the coefficient |Δα| on the width w or the wavelength x with $\dot{Q}=1$ W and $\bar{\epsilon}=0.5$, with a sine function for the spatial progress of the thermal expansion being assumed.

All values of Δα which lead to minimal aberrations at an absorbed thermal load of $\dot{Q}=1$ W and at a predetermined resulting emissivity of $\bar{\epsilon}=0.5$, lie according to the above equation on or below the curve 10*a*, i.e. in the hatched region 12*a*.

The FIGS. 5*b* through 5*e* show all homogeneity conditions which lie in the hatched area 12*a* of FIG. 5*a*, thus representing the conditions for optical components with even lower aberrations than optical components which meet the homogeneity requirements according to FIG. 5*a*.

Figure 5B:
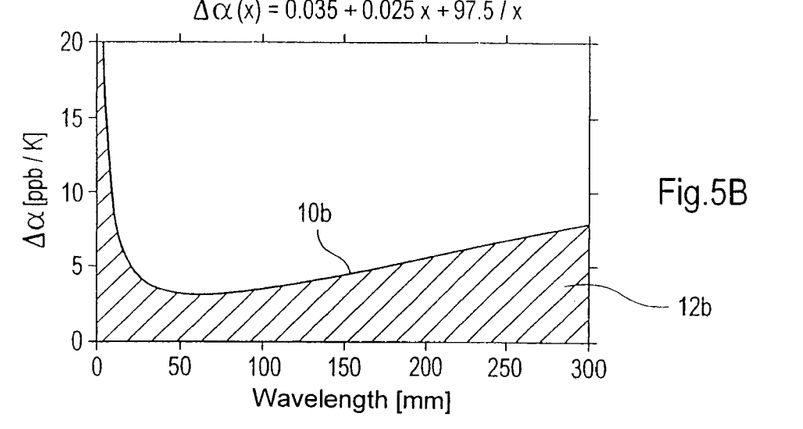
Figure 5C:
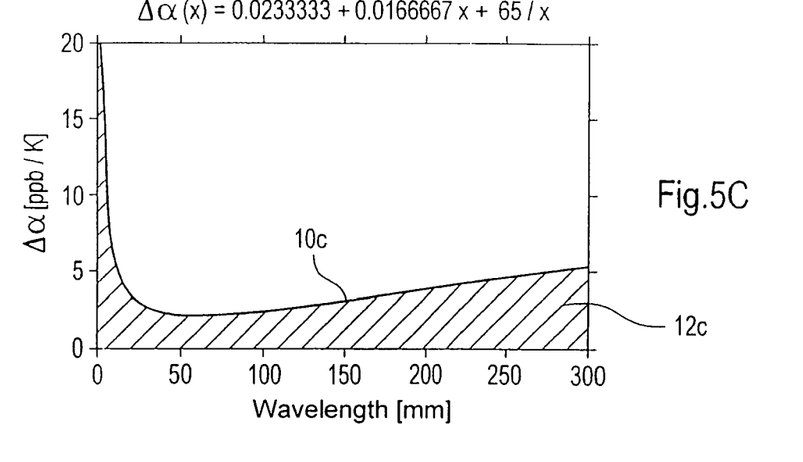
Figure 5D:
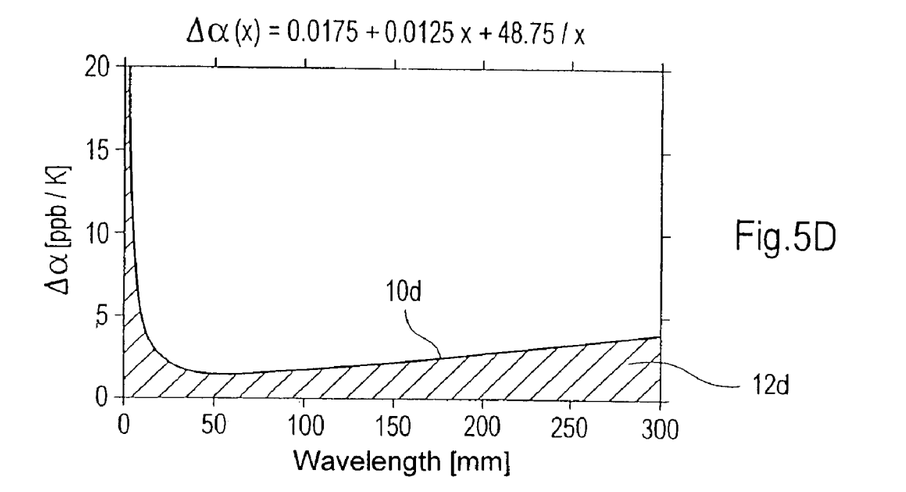
Figure 5E:
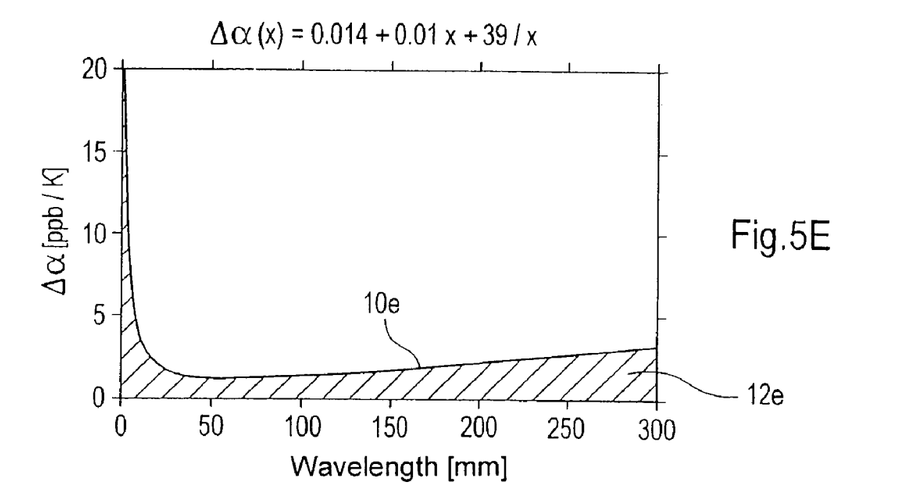

The homogeneity requirements placed on the optical component rise from FIG. 5*b* to FIG. 5*e*, i.e. if an optical component fulfils the homogeneity requirement as shown in FIG. 5*e* depending on the wavelength x, the optical component shows the lowest possible aberrations.

FIG. 5*b* shows the boundary curve 10*b* for the condition at an absorbed thermal load of $\dot{Q}=1$ W and at a predetermined resulting emissivity of $\bar{\epsilon}=0.5$ $$|\Delta\alpha| = \left(0.035 + \frac{0.025 \cdot x}{mm} + \frac{97.5 \text{ mm}}{x}\right)\frac{ppb}{K}$$

In FIG. 5*c*, the boundary curve 10*c* for the condition at an absorbed thermal load of $\dot{Q}=1$ W and at a predetermined resulting emissivity of $\bar{\epsilon}=0.5$ is $$|\Delta\alpha| = \left(0.0233 + \frac{0.0167 \cdot x}{mm} + \frac{65 \text{ mm}}{x}\right)\frac{ppb}{K}$$

In FIG. 5*d*, the boundary curve 10*d* for the condition at an absorbed thermal load of $\dot{Q}=1$ W and at a predetermined resulting emissivity of $\bar{\epsilon}=0.5$ is $$|\Delta\alpha| = \left(0.0175 + \frac{0.0125 \cdot x}{mm} + \frac{48.75 \text{ mm}}{x}\right)\frac{ppb}{K}$$

and in FIG. 5*e* the boundary curve 10*e* for the condition at an absorbed thermal load of $\dot{Q}=1$ W and at a predetermined resulting emissivity of $\bar{\epsilon}=0.5$ is $$|\Delta\alpha| = \left(0.014 + \frac{0.01 \cdot x}{mm} + \frac{39 \text{ mm}}{x}\right)\frac{ppb}{K}.$$

A material which meets the homogeneity requirements thus lies in the hatched region 12*a* to 12*d* as entered in the FIGS. 5*a* to 5*e* and below the curve 10*a* to 10*e* as defined by the above equation.

Figure 6:
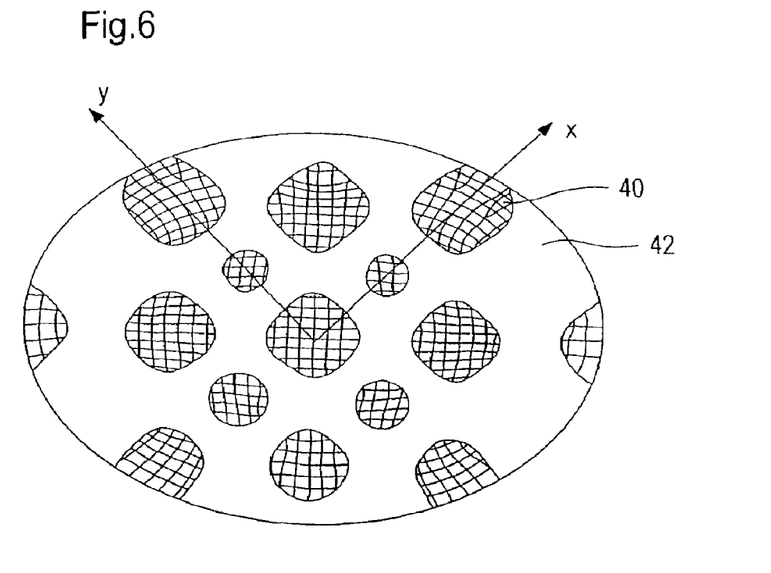
FIG. 6 shows a top view of the first mirror of a projection objective according to FIG. 8 with a substrate material which comprises an inhomogeneity zone of width w=x/2=20 mm.
Figure 7:
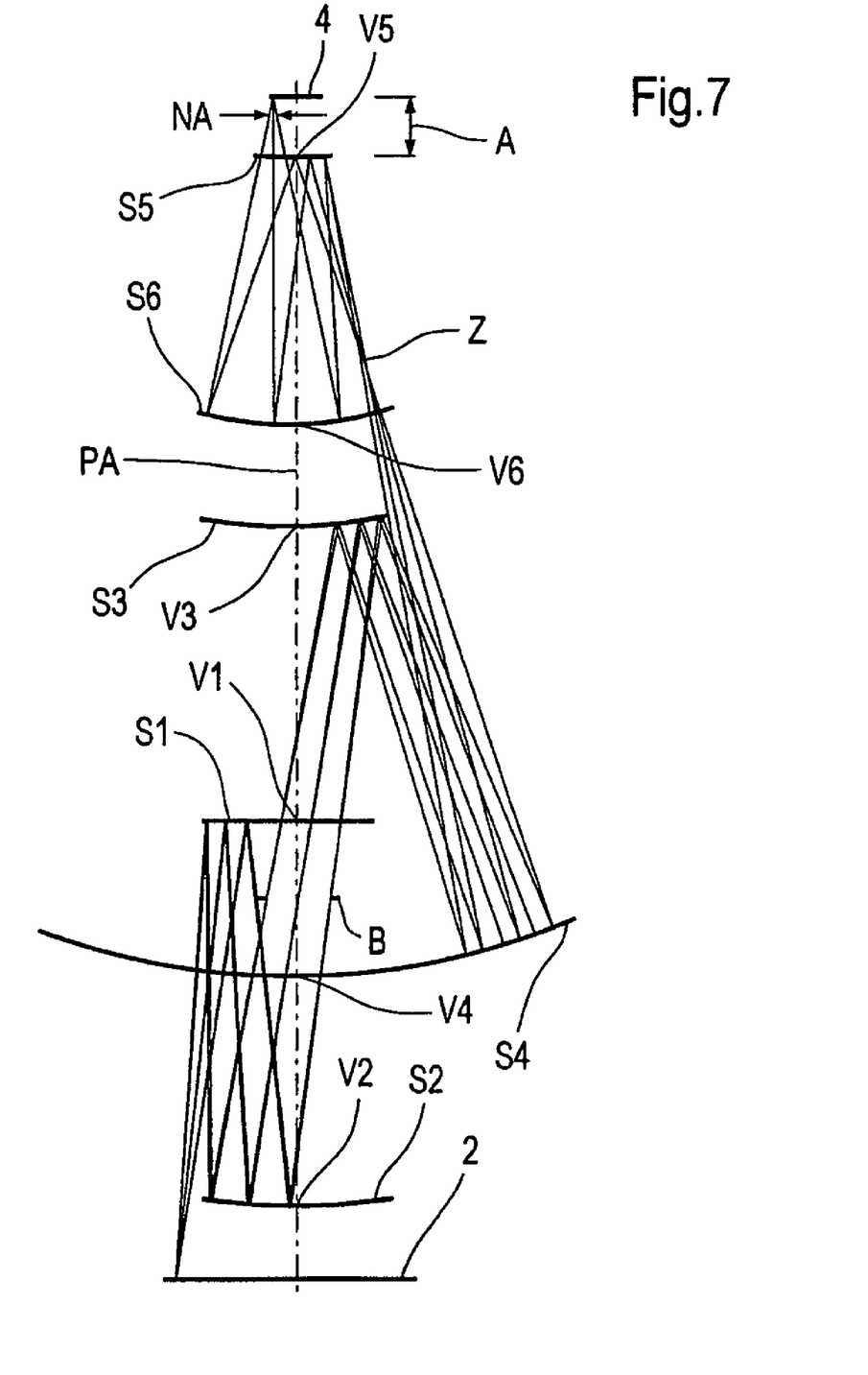
FIG. 7 shows a projection objective with six mirrors, of which at least one mirror is an optical component in accordance with the invention.

FIG. 6 shows a top view of a mirror surface with a substrate material with inhomogeneity zones of width w=20 mm, e.g. of the first mirror M1 of a projection objective shown in FIG. 7 comprising a total of six mirrors M1 to M6. Deformations as a result of a given absorbed thermal load $\dot{Q}$ of 1 W of a given amplitude Δa of ±5 ppb/K and a width of the inhomogeneity zones of w=20 mm according to a wavelength x=40 mm. The reference numeral 42 designates negative deformation amplitudes −Δh. The reference numeral 40 designates positive deformation amplitudes +Δh of the mirror surface, deviating from the middle mirror surface. The bright regions which are characterized with the reference numeral 40 are elevated. These deformations are measured in an interferometric manner. The absorbed thermal load $\dot{Q}$ is 1 W and the resulting emissivity is ±0.5.

FIG. 7 shows an EUV projection objective as known from U.S. Pat. No. 6,353,470. The EUV projection objective comprises a total of six mirrors, namely a first mirror S1, a second mirror S2, a third mirror S3, a fourth mirror S4, a fifth mirror S5 and a sixth mirror S6. An object in an object plane 2 is projected by the six-mirror projection objective to a reduced image in an image plane 4. The diaphragm B of the projection object is formed on the second mirror S2. The system is centered about the optical axis HA and comprises an intermediate image Z in the light path from the fourth mirror S4 to the fifth mirror S5.

The mirrors S1, S2, S3, S4, S5 and S6 of the projection objective are configured as normal-incidence mirrors with a substrate material and a multiple-layer system which is applied thereon and which consists of alternating Mo/Si layers. The substrate material of at least one mirror or several mirrors S1, S2, S3, S4, S5, S6 comprises a material in accordance with the invention whose fluctuation Δa of the temperature-dependent coefficient of thermal expansion lies within the demanded homogeneity requirements at a predetermined width w of the homogeneity zones.

The inventive idea of setting homogeneity requirements by purposeful Ti-doping of a quartz glass or by purposeful introduction of seed crystals in a glass ceramic material for producing substrate materials can also be applied to the coating of such substrate materials with a plurality of layers. The only condition is that the spatial distribution of the temperature-dependent coefficient of thermal expansion of the coating material can be influenced or set in a purposeful way.

The use for producing reticle masks would be possible.

Figure 8:
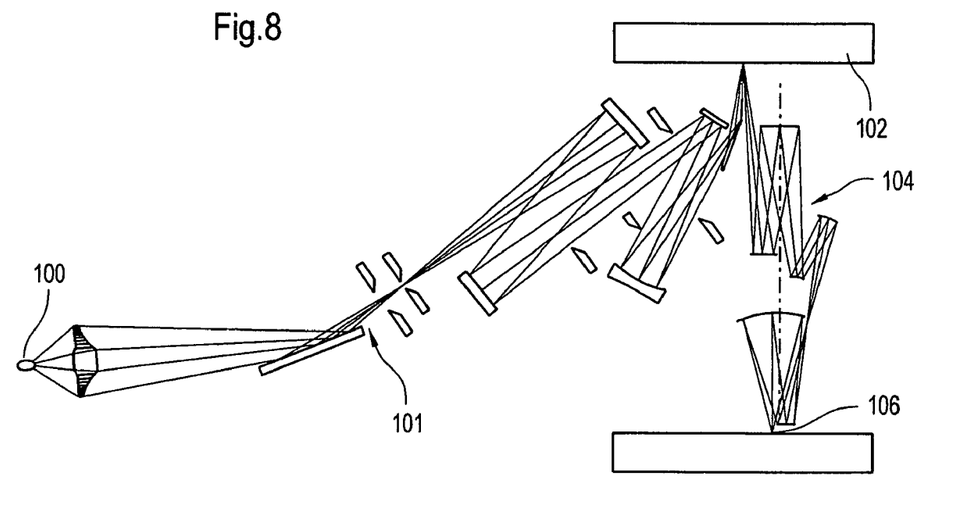
FIG. 8 shows an EUV projection exposure system with a light source, an illumination system and a projection objective.

FIG. 8 shows an EUV projection exposure system, comprising a light source 100 and an illumination system 101 for illuminating a field in a plane 102 in which a structure-bearing mask (a so-called reticle mask) is arranged, and a projection objective 104 comprising six mirrors for projecting the structure-bearing mask 102 in the plane 102 to a light-sensitive substrate in a plane 106. Reference is hereby made to EP-A 1 123 195 concerning the EUV illumination system, whose scope of disclosure is hereby fully included in the present application. Reference is hereby made to U.S. Pat. No. 6,353,470 concerning the six-mirror objective, whose scope of disclosure is hereby fully included in the present application.

Each of the optical components of the EUV projection exposure system, i.e. the optical components of the illumination system or the mirror of the projection objective or even the reticle or reflection mask, can be configured in accordance with the invention, meaning it can comprise a substrate material or even a coating whose fluctuation $\pm\Delta\alpha$ of the temperature-dependent coefficient of thermal expansion fulfils the homogeneity condition according to the invention depending on the width w the inhomogeneity zone.

The invention provides for the first time optical components, and especially mirrors for EUV projection objectives, which show minimal aberrations by a respective choice of material.

The invention claimed is:

1. An optical component comprising:
a material selected from the group consisting of glass ceramic and Ti-doped quartz glass, wherein said material has a coefficient of thermal expansion α, that is dependent on location and is periodic with a period x, in mm,
wherein $\alpha = \bar{\alpha} \pm \Delta\alpha$, where: $\bar{\alpha}$ is a mean value of said coefficient of thermal expansion; and
$\Delta\alpha$ is a maximum deviation of said coefficient of thermal expansion from said mean value,
and
wherein $$|\Delta\alpha| \leq \left(0.14 + 0.1 \cdot x + \frac{390}{x}\right) \cdot \frac{\bar{\epsilon}}{\dot{Q}}$$

where: $\dot{Q}$ is thermal power absorbed by said optical component, in watts, $\bar{\epsilon}$ is resulting emissivity, and $|\Delta\alpha|$ is absolute value of $\Delta\alpha$, in units of $$\frac{ppb}{K}.$$

2. The optical component according to claim 1, wherein $$|\Delta\alpha| \leq \left(0.07 + 0.05 \cdot x + \frac{195}{x}\right) \cdot \frac{\bar{\epsilon}}{\dot{Q}}$$

3. The optical component according to claim 1, wherein $$|\Delta\alpha| \leq \left(0.0467 + 0.0333 \cdot x + \frac{130}{x}\right) \cdot \frac{\bar{\epsilon}}{\dot{Q}}$$

4. The optical component according to claim 1, wherein $$|\Delta\alpha| \leq \left(0.0350 + 0.025 \cdot x + \frac{97.5}{x}\right) \cdot \frac{\bar{\epsilon}}{\dot{Q}}$$

5. The optical component according to claim 1, wherein $$|\Delta\alpha| \leq \left(0.028 + 0.02 \cdot x + \frac{78}{x}\right) \cdot \frac{\bar{\epsilon}}{\dot{Q}}$$

6. The optical component according to claim 1,
wherein said material is said Ti-doped quartz glass, and
wherein said coefficient of thermal expansion is influenced in a location-dependent manner by a Ti content in said Ti-doped quartz glass.

7. The optical component according to claim 1,
wherein said material is said glass ceramic, and
wherein said glass ceramic comprises a share of an amorphous phase and a share of a crystalline phase,
wherein said crystalline phase is induced by seed crystals and is controlled by a heat treatment, and
wherein said coefficient of thermal expansion is influenced in a location-dependent manner by said seed crystals and said heat treatment.

8. The optical component according to claim 1,
wherein said coefficient of thermal expansion is temperature-dependant, and
wherein $$\overline{\alpha}(T) = m \cdot (T-T_0)$$

where $\overline{\alpha}(T)$ is a temperature-dependent mean value of said coefficient of thermal expansion,
m is a rise
T is a temperature, and
$T_0$ is a temperature at which $\overline{\alpha}(T)=0$.

9. The optical component according to claim 8, wherein $$|m| < 1 \cdot 10^{-6} \cdot K^{-2}.$$

10. The optical component according to claim 1, further comprising a coating on said material.

11. The optical component according to claim 10, wherein said optical component is a reticle mask for EUV lithography.

12. The optical component according to claim 10, wherein said optical component is a mirror for EUV lithography.

13. The optical component according to claim 10, wherein said coating comprises a material selected from the group consisting of ruthenium, palladium and rhodium.

14. The optical component according to claim 10, wherein said coating comprises a layer pair selected from the group consisting of:
a layer of Mo and a layer of Si;
a layer of Mo a layer of Be; and
a layer of MoRu and a layer of Be.

15. An illumination system for illuminating a field in a plane with radiation having a wavelength less than or equal to 193 nm, wherein said illumination system comprises:
an optical component comprising:
a material selected from the group consisting of glass ceramic and Ti-doped quartz glass,
wherein said material has a coefficient of thermal expansion α that is dependent on location
and is periodic with a period x, in mm,
wherein $$\alpha = \overline{\alpha} \pm \Delta\alpha,$$

where: $\overline{\alpha}$ is a mean value of said coefficient of thermal expansion; and
Δα is a maximum deviation of said coefficient of thermal expansion from said mean value,
and
wherein $$|\Delta\alpha| \leq \left(0.14 + 0.1 \cdot x + \frac{390}{x}\right) \cdot \frac{\overline{\varepsilon}}{\dot{Q}}$$

where: $\dot{Q}$ is thermal power absorbed by said optical component, in watts, $\overline{\varepsilon}$ is resulting emissivity, and
|Δα| is absolute value of Δα, in units of $$\frac{ppb}{K}.$$

16. A projection objective for projecting an object in an object plane to an image in an image plane with radiation having a wavelength less than or equal to 193 nm, wherein said projection objective comprises:
an optical component comprising:
a material selected from the group consisting of glass ceramic and Ti-doped quartz glass,
wherein said material has a coefficient of thermal expansion α that is dependent on location
and is periodic with a period x, in mm,
wherein $$\alpha = \overline{\alpha} \pm \Delta\alpha,$$

where: $\overline{\alpha}$ is a mean value of said coefficient of thermal expansion; and
Δα is a maximum deviation of said coefficient of thermal expansion from said mean value,
and
wherein $$|\Delta\alpha| \leq \left(0.14 + 0.1 \cdot x + \frac{390}{x}\right) \cdot \frac{\overline{\varepsilon}}{\dot{Q}}$$

where: $\dot{Q}$ is thermal power absorbed by said optical component, in watts, $\overline{\varepsilon}$ is resulting emissivity, and
|Δα| is absolute value of Δα, in units of $$\frac{ppb}{K}.$$

17. The projection objective according to claim 16, wherein said optical component is a mirror.

18. A projection exposure system for microlithography, comprising:
a radiation source that generates radiation;
an illumination system that partly collects said radiation and forwards said radiation with a ring field for illuminating a plane;
a structure-bearing mask on a carrier system, wherein said structure-bearing mask is situated in a plane of said ring field;
a projection objective that projects an illuminated part of said structure-bearing mask to an image field; and
a light-sensitive substrate on a carrier system, wherein said light-sensitive substrate is situated in a plane of said image field,
wherein at least one of the said illumination system, said structure-bearing mask or said projection objective includes an optical component comprising:
a material selected from the group consisting of glass ceramic and Ti-doped quartz glass,
wherein said material has a coefficient of thermal expansion α that is dependent on location
and is periodic with a period x, in mm,
wherein $$\alpha = \overline{\alpha} \pm \Delta\alpha,$$

where: $\overline{\alpha}$ is a mean value of said coefficient of thermal expansion; and Δα is a maximum deviation of said coefficient of thermal expansion from said mean value,
and
wherein $$|\Delta\alpha| \leq \left(0.14 + 0.1 \cdot x + \frac{390}{x}\right) \cdot \frac{\overline{\varepsilon}}{\dot{Q}}$$

where: $\dot{Q}$ is thermal power absorbed by said optical component, in watts, $\overline{\varepsilon}$ is resulting emissivity, and $|\Delta\alpha|$ is absolute value of $\Delta\alpha$, in units of $$\frac{ppb}{K}.$$

19. A method comprising:
(A) illuminating a light-sensitive substrate with a projection exposure system having:
a radiation source that generates radiation;
an illumination system that partly collects said radiation and forwards said radiation with a ring field for illuminating a plane;
a structure-bearing mask on a carrier system, wherein said structure-bearing mask is situated in a plane of said ring field;
a projection objective that projects an illuminated part of said structure-bearing mask to an image field; and
a light-sensitive substrate on a carrier system, wherein said light-sensitive substrate is situated in a plane of said image field,
wherein at least one of said illumination system, said structure-bearing mask or said projection objective includes an optical component comprising:
a material selected from the group consisting of glass ceramic and Ti-doped quartz glass,
wherein said material has a coefficient of thermal expansion α that is dependent on location and is periodic with a period x, in mm,
wherein $\alpha = \overline{\alpha} \pm \Delta\alpha,$ where: $\overline{\alpha}$ is a mean value of said coefficient of thermal expansion; and $\Delta\alpha$ is a maximum deviation of said coefficient of thermal expansion from said mean value,
and
wherein $$|\Delta\alpha| \leq \left(0.14 + 0.1 \cdot x + \frac{390}{x}\right) \cdot \frac{\overline{\varepsilon}}{\dot{Q}}$$

where: $\dot{Q}$ is thermal power absorbed by said optical component, in watts, $\overline{\varepsilon}$ is resulting emissivity, and $|\Delta\alpha|$ is absolute value of $\Delta\alpha$, in units of $$\frac{ppb}{K}.$$

and
(B) producing a microelectronic component from said light-sensitive substrate.
20. An optical component comprising:
a material selected from the group consisting of glass ceramic and Ti-doped quartz glass,
wherein said material a coefficient of thermal expansion α that is dependent on location and is periodic with a period greater than or equal to 40 mm,
wherein $\alpha = \overline{\alpha} \pm \Delta\alpha,$ where: $\overline{\alpha}$ is a mean value of said coefficient of thermal expansion; and $\Delta\alpha$ is a maximum deviation of said coefficient of thermal expansion from said mean value,
and
wherein $|\Delta\alpha| \leq 5$ where $|\Delta\alpha|$ is absolute value of $\Delta\alpha$, in units of $$\frac{ppb}{K}.$$

21. The optical component according to claim 20,
wherein said material is said Ti-doped quartz glass, and
wherein said coefficient of thermal expansion is influenced in a location-dependent manner by a Ti content in said Ti-doped quartz glass.
22. The optical component according to claim 20,
wherein said material is said glass ceramic, and
wherein said glass ceramic material comprises a share of an amorphous phase and a share of a crystalline phase,
wherein said crystalline phase is induced by seed crystals and is controlled by a heat treatment, and
wherein said coefficient of thermal expansion is influenced in a location-dependent manner by said seed crystals and said heat treatment.
23. The optical component according to claim 20,
wherein said coefficient of thermal expansion is temperature-dependent, and
wherein $\overline{\alpha}(T) = m \cdot (T - T_0)$ where $\overline{\alpha}(T)$ is a temperature-dependent mean value of said coefficient of thermal expansion,
m is a rise
T is a temperature, and
$T_0$ is a temperature at which $\overline{\alpha}(T) = 0$.
24. The optical component according to claim 23, wherein $|m| < 1 \cdot 10^{-6} \cdot K^{-2}$.
25. The optical component according to claim 20, further comprising a coating on said material.
26. The optical component according to claim 25, wherein said optical component is a reticle mask for EUV lithography.
27. The optical component according to claim 25, wherein said optical component is a mirror for EUV lithography.
28. The optical component according to claim 25, wherein said coating comprises a material selected from the group consisting of ruthenium, palladium and rhodium.
29. The optical component according to claim 25, wherein said coating comprises a layer pair selected from the group consisting of:
a layer of Mo and a layer of Si;
a layer of Mo and a layer of Be;
a layer of MoRu and a layer of Be.

30. The optical component of claim 20, wherein said optical component absorbs thermal power of about 1 watt (W) and has a resulting emissivity of about 0.5.

31. An illumination system for illuminating a field in a plane with radiation having a wavelength less than or equal to 193 nm, wherein said illumination system comprises:
   an optical component comprising:
      a material selected from the group consisting of glass ceramic and Ti-doped quartz glass,
      wherein said material has a coefficient of thermal expansion α that is dependent on location and is periodic with a period greater than or equal to 40 mm,
   wherein $\alpha = \overline{\alpha} \pm \Delta\alpha$, where: $\overline{\alpha}$ is a mean value of said coefficient of thermal expansion; and
      $\Delta\alpha$ is a maximum deviation of said coefficient of thermal expansion from said mean value,
   and
   wherein $|\Delta\alpha| \leq 5$ where $|\Delta\alpha|$ is absolute value of $\Delta\alpha$, in units of $$\frac{ppb}{K}.$$

32. A projection objective for projecting an object in an object plane to an image in an image plane with radiation having a wavelength less than or equal to 193 nm, wherein said projection objective comprises:
   an optical component comprising:
      a material selected from the group consisting of glass ceramic and Ti-doped quartz glass,
      wherein said material has a coefficient of thermal expansion α that is dependent on location and is periodic with a period greater than or equal to 40 mm,
   wherein $\alpha = \overline{\alpha} \pm \Delta\alpha$, where: $\overline{\alpha}$ is a mean value of said coefficient of thermal expansion; and $\Delta\alpha$ is a maximum deviation of said coefficient of thermal expansion from said mean value,
   and
   wherein $|\Delta\alpha| \leq 5$ where $|\Delta\alpha|$ is absolute value of $\Delta\alpha$, in units of $$\frac{ppb}{K}.$$

33. A The projection objective according to claim 32, further comprising a plurality of mirrors for directing said radiation.

34. A projection exposure system for microlithography, comprising:
   a radiation source for generating radiation;
   an illumination system that partly collects said radiation and forwards said radiation with a ring field for illuminating a plane;
   a structure-bearing mask on a carrier system, wherein said structure-bearing mask is situated in a plane of said ring field;
   a projection objective that projects an illuminated part of said structure-bearing mask to an image field;
   a light-sensitive substrate on a carrier system, wherein said light-sensitive substrate is situated in a plane of said image field,
   wherein at least one of said illumination system, said structure-bearing mask or said projection objective includes an optical component comprising:
      a material selected from the group consisting of glass ceramic and Ti-doped quartz glass,
      wherein said material has a coefficient of thermal expansion α that is dependent on location and is periodic with a period greater than or equal to 40 mm,
   wherein $\alpha = \overline{\alpha} \pm \Delta\alpha$, where: $\overline{\alpha}$ is a mean value of said coefficient of thermal expansion; and $\Delta\alpha$ is a maximum deviation of said coefficient of thermal expansion from said mean value,
   and
   wherein $|\Delta\alpha| \leq 5$ where $|\Delta\alpha|$ is absolute value of $\Delta\alpha$, in units of $$\frac{ppb}{K}.$$

* * * * *